July 25, 1967 R. D. McNUTT 3,333,225

CONNECTOR

Filed June 29, 1964

INVENTOR
ROBERT D. MCNUTT

BY [signature]

ATTORNEY

United States Patent Office 3,333,225

Patented July 25, 1967

3,333,225

CONNECTOR

Robert D. McNutt, Poughkeepsie, N.Y., assignor to International Business Machines Corporation, New York, N.Y., a corporation of New York Filed June 29, 1964, Ser. No. 378,563

1 Claim. (Cl. 339—17)

This invention relates to electrical connectors and more particularly to electrical connectors adapted for use with high-speed circuitry.

High speed data processing packaging techniques often dictate that printed circuit boards, either multilayer or single layer, be used as both the supporting mechanism for and electrical interconnections between modular electronic circuitry. In such schemes, the module pins are inserted into conductive through holes in the circuit board and the circuit board automatically provides the desired electrical interconnections. To configure a complete system, a number of circuit boards are positioned in a planar manner and then interconnected. Such a packaging system is described in the IBM Journal of Research and Development, July 1963, pp. 182–189, particularly page 188, in a paper entitled, "A Circuit Packaging Model for High-Speed Computer Technology," by F. K. Buelow et al.

Multilayer circuit boards, such as are described in the above publication, have specific layers allocated for use as signal circuit interconnectors, voltage distribution lines and ground planes. Since these boards are designed for use with extremely high speed circuitry, every signal line is considered a transmission line and its length, characteristic impedance, and terminating impedances are carefully specified and controlled. At the edge of each board, certain signal lines are brought out to plated through-hole connectors for interconnection with other circuit boards. A single board may have over 200 connection points at a single edge.

Many prior art connectors were investigated and found lacking for the purpose of connecting circuit boards of the above-described type. First, the connector has to be easily and reliably insertable and removable to allow circuit board changes. The connector must be flexible in its interconnection pattern so that the board changes do not necessitate entirely new connectors. Additionally, a large impedance mismatch at the connector cannot be tolerated since the resulting electrical reflections seriously degrade circuit operations. No connector was found which fulfilled all of these requirements.

Accordingly, it is an object of this invention to provide an improved connector.

It is a further object of this invention to provide a connector adaptable for use with high speed circuitry.

Another object of this invention is to provide a connector which has a flexible interconnection pattern.

Still another object of this invention is to provide a connector adapted for use with high speed circuits wherein the connector interconnections are impedance matched to the circuit impedances.

A further object of this invention is to provide a high density circuit interconnector whose connecting pins are continuously protected from deforming forces.

And yet another object of this invention is to provide a circuit board interconnector which provides high density impedance matched reliable interconnections between circuits on a plurality of circuit boards.

In accordance with the above-stated objects, a connector is provided with a plurality of spaced and aligned conductive pins extending therefrom. Slidably mounted on the conductive pins is a circuit board having selectively interconnected conductive apertures at corresponding positions to the conductive pins. When the connector is used to connect a pair of circuit boards, the circuit board both retains the alignment of the pins and simultaneously provides desired, impedance-matched electrical interconnections.

The foregoing and other objects, features and advantages of the invention will be apparent from the following more particular description of a preferred embodiment of the invention, as illustrated in the accompanying drawings.

Figure 1:
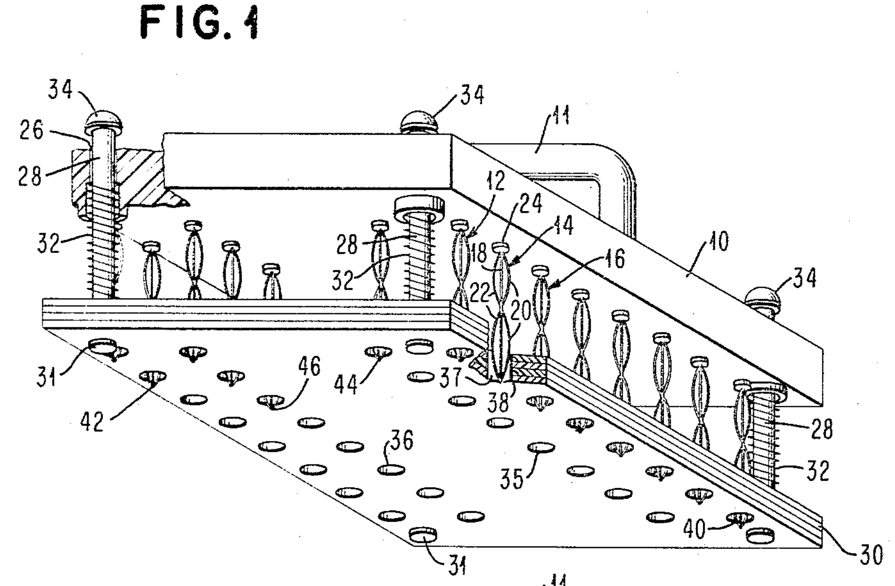
FIG. 1 is a partially sectioned isometric view of a connector embodying the elements of the invention.

Referring now to FIG. 1, connector body 10 has a handle 11 affixed to its upper side and a plurality of spaced and aligned connector pins 12, 14, 16, etc., fixedly mounted on its underside. Each connector pin (e.g., 14) includes a stiff inner conductor 18 extending the entire length of the pin and resilient outer conductors 20 and 22 crimped at their midpoint and ends to form a double "egg beater" shape. Conductive elements 18, 20 and 22 are rigidly held by plug 24 which is in turn mounted in connector body 10. Any well known manner of connection between plug 24 and connector body 10 may be used since connector body 10 performs only a supporting function and provides no electrical interconnections between the pins.

Connector body 10 has four holes 26 (see cutout section) in which shafts 28 are slidably mounted. Each shaft 28 extends slightly through and is attached to a corner of a multilayer circuit board 30. The purpose for extended portions 31 of the shafts 28 is alignment and will be discussed in greater detail hereinafter. A spring 32 around each shaft 28 biases multilayer circuit board 30 away from connector body 10. Caps 34 restrain shafts 28 from being pulled out of connector body 10 by springs 32.

Circuit board 30 is provided with a plurality of conductively coated-through holes 35, 36, 37, etc., each of which is respectively aligned and mates with a connector pin. As shown in the cutaway section of circuit board 30, inner surface 38 of through hole 37 is coated with a conductor such as copper and electrically interconnects flexible conductors 20 and 22 of connector pin 14 with the interior circuitry contained in circuit board 30.

Multilayer circuit board 30 performs several functions, its first being to electrically interconnnect various of the pins 12, 14, 16, etc. For example, while not shown, one layer of the circuit board 30 might interconnect pin 40 to pin 42 while another might interconnect pin 44 to pin 46, etc. Additionally, separate layers of circuit board 30 may be allocated to interconnect power circuits while other layers are used for signal interconnections. The interconnecting circuitry within circuit board 30 is preferably produced by the same techniques which are used to produce the main circuit boards with which the connector is designed to be used. In this manner, the line impedances, line widths and thicknesses, dielectric constants and other characteristics of circuit board 30 can be carefully matched to the main circuit boards. A further function of multilayer circuit board 30 is to prevent misalignment of the connector pins when the connector is inserted into or extracted from a circuit board. Conductive through-holes 35–37, etc., completely protect the connector pins from being bent or otherwise misaligned when the connector is not in use. When the connector is in use (as will be further described in relation to FIGS. 3 and 4), the pins are protected by the circuit boards into which they are inserted.

By using multilayer circuit board 30 as the electrical interconnector between the pins, connector changes are easily provided. It is merely necessary to remove caps 34 from shafts 28, withdraw circuit board 30 and its associated shafts 28 from holes 26, either remove shafts 28 or leave them embedded in circuit board 30, and replace the old circuit board for a new one. The connector body 10 and pins 12, 14, 16, etc., remain to be reused again and again as the situation requires.

Figures 2, 3, 4:
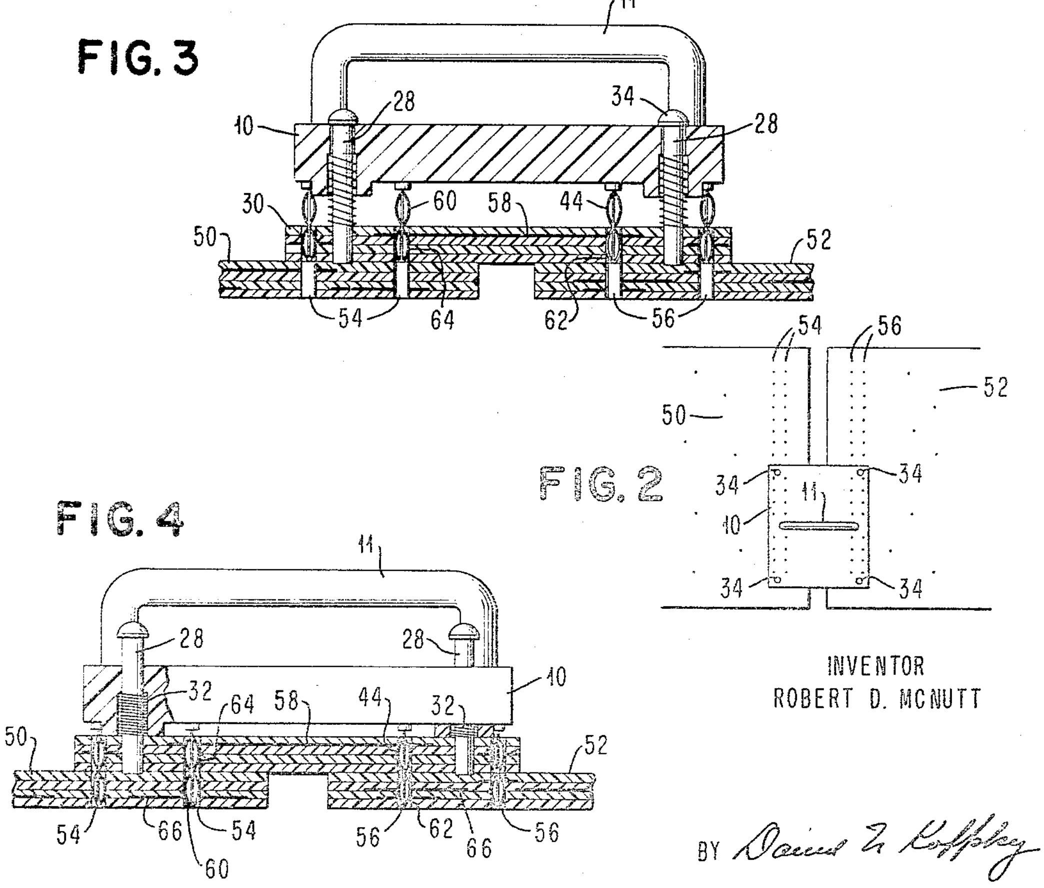
FIG. 2 is a plan view showing the connector of FIG. 1 being used to interconnect two circuit boards.
FIG. 3 is a front section of the connector as it is being readied to interconnect a pair of circuit boards.
FIG. 4 is a front section of the connector after its connecting pins have been inserted into a pair of circuit boards.

Referring now to FIGS. 2, 3 and 4, the operation of the connector shown in FIG. 1 will be described. In FIG. 2, a pair of abutting multilayer circuit boards 50 and 52 are to be interconnected with the connector of FIG. 1. To prevent the connector's size from becoming too unwieldy, a plurality of connectors may be used to interconnect the circuit boards. In FIG. 2, two connectors are required with only one being shown. Each circuit board has two rows of plated-through holes 54 and 56 respectively, each hole being connected to a specific interior circuit within a circuit board. Circuit boards 50 and 52 are interconnected by first placing the connector over the boards so that its connector pins are aligned with conductive through-holes 54 and 56. The alignment of the connector pins may be aided by providing small depressions in circuit boards 50 and 52 which mate with lower portions 31 of shafts 28 (FIG. 1).

FIG. 3 shows a front view of the connector before the electrical connections are made, but after its pins have been aligned with holes 54 and 56 of circuit boards 50 and 52. An exemplary conductive land 58 is shown in multilayer circuit board 30 connecting conductive pin 60 to conductive pin 44. To cause the desired interconnection to be made, handle 11 is pressed down thereby forcing the lower resilient portions of the connecting pins to enter plated-through holes 54 and 56 respectively. Since circuit board 30 remains stationary (it being constrained by circuit boards 50 and 52) the downward movement of connector body 10 compresses springs 32 and forces upper resilient portions of connecting pins 44, 60, etc. into plated-through holes 62, 64, etc.

Once the connector pins are fully inserted (FIG. 4) all desired electrical connections are automatically made. For instance, an interconnection is made from conductive land 66 in circuit board 50 through conductive pin 60, plated-through hole 64, conductive land 58, plated-through hole 62, conductive pin 44 to conductive land 66 in circuit board 52.

To withdraw the connector, handle 11 is pulled and the connecting pins are withdrawn. As the connecting pins emerge from circuit boards 50 and 52, springs 32 expand and maintain circuit board 30 in contact with circuit boards 50 and 52. When the connector pins are entirely withdrawn, caps 34 restrain circuit board 30 from being forced any further outwardly but at this time the connector pins are completely protected (as shown in FIG. 3).

While the invention has been particularly shown and described with reference to a preferred embodiment thereof, it will be understood by those skilled in the art that the foregoing and other changes in form and details may be made therein without departing from the spirit and scope of the invention.

What is claimed is:

A connector for interconnecting a pair of printed circuit boards, the circuitry contained in said printed circuit boards exhibiting predetermined circuit characteristics, said circuitry terminating at conductive holes in said printed circuit boards, the connector comprising:

a connector body;

a plurality of conductive pins extending from said body, each said pin having upper and lower resilient enlarged portions, said pins spaced and aligned so as to allow their lower resilient enlarged portions to mate with said conductive holes in said printed circuit boards when said connector pins are inserted thereinto;

an interconnecting circuit board having interconnected conductive through holes at corresponding positions to said conductive pins, said board slidably mounted on said conductive pins and adapted to retain the alignment of said conductive pins and provide desired electrical connections between the upper resilient enlarged portions of said conductive pins when said pins are inserted into said conductive holes;

a shaft affixed to each corner of said interconnecting circuit board, each said shaft slidably mounted in said connector body; and a spring wound around each shaft, said springs acting to bias said interconnecting circuit board away from said connector body.

References Cited

UNITED STATES PATENTS

| | | | |
|---|---|---|---|
| 1,652,708 | 12/1927 | De Leeuw | 339—18 |
| 2,639,341 | 5/1953 | Truax | 200—51 |
| 2,714,194 | 7/1955 | Beynink | 339—18 |
| 3,097,032 | 7/1963 | Hochheiser | 339—17 |
| 3,167,373 | 1/1965 | Kostich | 339—45 X |
| 3,205,469 | 9/1965 | Frank et al. | 339—18 |

MARVIN A. CHAMPION, *Primary Examiner.*

ALFRED S. TRASK, *Examiner.*

P. A. CLIFFORD, *Assistant Examiner.*